US009829775B2

United States Patent
Masuda

(10) Patent No.: US 9,829,775 B2
(45) Date of Patent: Nov. 28, 2017

(54) SEMICONDUCTOR ELEMENT COOLING STRUCTURE AND ELECTRONIC APPARATUS PROVIDED WITH SAME

(71) Applicant: Naoki Masuda, Tokyo (JP)

(72) Inventor: Naoki Masuda, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 61 days.

(21) Appl. No.: 14/758,173

(22) PCT Filed: Dec. 28, 2012

(86) PCT No.: PCT/JP2012/084097
§ 371 (c)(1),
(2) Date: Jun. 26, 2015

(87) PCT Pub. No.: WO2014/103019
PCT Pub. Date: Jul. 3, 2014

(65) Prior Publication Data
US 2015/0355533 A1    Dec. 10, 2015

(51) Int. Cl.
*G03B 21/16*     (2006.01)
*H01S 5/024*     (2006.01)
(Continued)

(52) U.S. Cl.
CPC ........... *G03B 21/16* (2013.01); *G03B 21/204* (2013.01); *G03B 21/2013* (2013.01);
(Continued)

(58) Field of Classification Search
CPC ........ G03B 21/16; G03B 21/20; G03B 21/14; H01S 5/02; H05K 7/20; H01L 2924/00; H01L 23/36
See application file for complete search history.

(56) References Cited

U.S. PATENT DOCUMENTS

2004/0182542 A1* 9/2004 Take .................. H01L 23/3672
165/80.3
2012/0327377 A1* 12/2012 Ohsugi ............... H04N 9/3111
353/38
(Continued)

FOREIGN PATENT DOCUMENTS

JP    S61-061493 A    3/1986
JP    H05-167143 A    7/1993
(Continued)

OTHER PUBLICATIONS

International Search Report (ISR) (PCT Form PCT/ISA/210), in PCT/JP2012/084097, dated Feb. 12, 2013.

*Primary Examiner* — Sultan Chowdhury
*Assistant Examiner* — Danell L Owens
(74) *Attorney, Agent, or Firm* — McGinn IP Law Group, PLLC.

(57) ABSTRACT

A structure for cooling a semiconductor element includes an element body and a lead terminal extending from one surface of the element body in a direction intersecting the one surface. The semiconductor element cooling structure includes a heat sink. The heat sink includes a contact surface that is in contact with the one surface of the element body, a through-hole which is formed in the contact surface and through which the lead terminal passes, and a space portion that communicates with the through-hole and that is configured to house a substrate connected to the lead terminal.

13 Claims, 5 Drawing Sheets

(51) Int. Cl.
*H05K 7/20* (2006.01)
*G03B 21/20* (2006.01)
*H01S 5/022* (2006.01)
*H01S 5/40* (2006.01)

(52) U.S. Cl.
CPC ...... *H01S 5/02469* (2013.01); *H01S 5/02476* (2013.01); *H05K 7/20409* (2013.01); *G03B 21/208* (2013.01); *H01L 2924/0002* (2013.01); *H01S 5/02212* (2013.01); *H01S 5/4025* (2013.01)

(56) References Cited

U.S. PATENT DOCUMENTS

| 2013/0057834 | A1* | 3/2013 | Yoshida | B23P 11/00 353/38 |
| 2013/0070215 | A1* | 3/2013 | Higo | G03B 21/204 353/85 |
| 2014/0130845 | A1* | 5/2014 | Ohki | H01L 31/0508 136/246 |

FOREIGN PATENT DOCUMENTS

| JP | 2008-177448 A | 7/2008 |
| JP | 2010-249521 A | 11/2010 |
| JP | 2011-096790 A | 5/2011 |
| JP | 2012-009760 A | 1/2012 |

* cited by examiner

SEMICONDUCTOR ELEMENT COOLING STRUCTURE AND ELECTRONIC APPARATUS PROVIDED WITH SAME

TECHNICAL FIELD

The present invention relates to a structure for cooling a semiconductor element, and an electronic apparatus provided with the structure, in particular a projection type display apparatus.

BACKGROUND ART

In general, the semiconductor element is used for the electronic apparatus. The projection type display apparatus for projecting an image includes a semiconductor element such as a light emitting element or an image forming element. Such a semiconductor element generates heat when operated.

The increased temperature of the semiconductor element may disable the normal operation of the semiconductor element. In particular, when the temperature of the light emitting element serving as a light source for the projection type display apparatus increases, the emission efficiency of the light emitting element declines, thus preventing the light emitting element from supplying a sufficient amount of light. As a result, the brightness of the projected image is reduced. For this reason, there has been proposed a structure for cooling the semiconductor element (hereinafter, referred to as "semiconductor element cooling structure").

The example of the semiconductor element cooling structure is disclosed in JP2012-9760A (hereinafter, referred to as "Patent Literature 1"). Hereinafter, the semiconductor element cooling structure disclosed in Patent Literature 1 will be described.

The semiconductor element cooling structure includes a light emitting element that is a semiconductor element, and a heat sink made of a metallic material such as aluminum or copper. The light emitting element includes a lead terminal extending from the bottom surface of an element body, and the lead terminal is electrically connected to a substrate. The substrate is housed in a U-shaped groove formed in the front side of the heat sink, and the bottom surface of the element body is in contact with the front side of the heat sink. The heat sink absorbs and discharges heat from the element body, thereby cooling the light emitting element.

The substrate is disposed along the extending direction of the lead terminal. Accordingly, the opening of the groove can be relatively small, and the area of the portion of the bottom surface of the element body in contact with the front side of the heat sink (hereinafter, referred to as "contact portion") can be relatively large. The large area of the contact portion facilitates movement of the heat of the element body to the heat sink, thereby facilitating cooling of the light emitting element.

CITATION LIST

Patent Literature 1: JP2012-9760A

SUMMARY OF INVENTION

However, in the semiconductor element cooling structure disclosed in Patent Literature 1, a space for housing the substrate is defined by the U-shaped groove. This imposes a limit on the size reduction of the opening of the groove. As a result, the contact portion cannot be formed sufficiently large, nor can the light emitting element that is the semiconductor element be satisfactorily cooled.

The example of the object of the present invention is to provide a semiconductor element cooling structure capable of more efficiently cooling a semiconductor element.

Solution to Problem

According to an aspect of the present invention, there is provided a semiconductor element cooling structure for cooling a semiconductor element. The semiconductor element cooling structure includes a heat receiving unit and a heat radiation unit. The heat receiving unit is configured to receive heat emitted from the semiconductor element. The heat radiation unit is configured to radiate the heat from the heat receiving unit. The heat receiving unit includes an element contact portion having a contact surface to which one surface of the semiconductor element is fitted, and a heat diffusion portion that is contact with the element contact portion and the heat radiation unit. The element contact portion includes a space portion. The contact surface includes a through-hole which communicates with the space portion and through which the terminal of the semiconductor element is inserted. The space portion houses a substrate to which the terminal of the semiconductor element is connected.

Effects of Invention

According to the present invention, semiconductor element can be cooled more efficiently.

DESCRIPTION OF EMBODIMENT

Next, the embodiments of the present invention will be described in detail with reference to the drawings.

Figure 1:
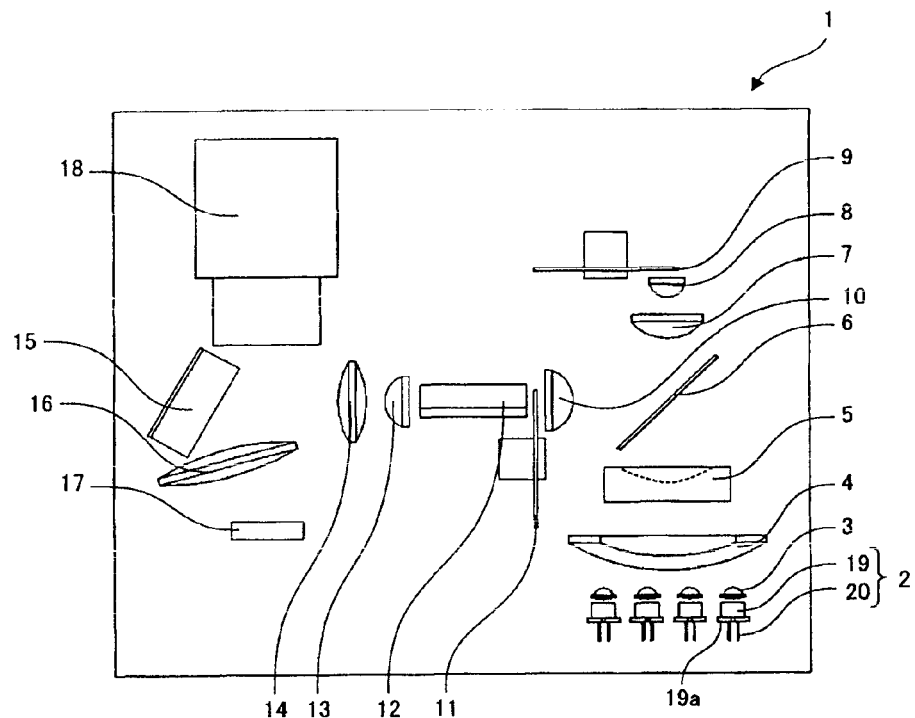
FIG. 1 A schematic plan view illustrating the inside of a projection type display apparatus.

First, the example of a projection type display apparatus provided with a semiconductor element cooling structure will be described referring to FIG. 1. FIG. 1 is a schematic plan view illustrating the inside of the projection type display apparatus. Note that the semiconductor element cooling structure is not illustrated in FIG. 1.

As illustrated in FIG. 1, projection type display apparatus 1 includes light emitting element 2 such as a laser diode. A laser beam emitted from light emitting element 2 passes through condenser lenses 3 to 5, dichroic mirror 6, and condenser lenses 7 and 8 to be applied to wheel plate 9 coated with a phosphor. The phosphor of wheel plate 9 emits visible light when irradiated with the laser beam.

The light emitted from the phosphor passes through condenser lenses 8 and 7, is reflected by dichroic mirror 6 to be directed toward condenser lens 10, and is condensed on one point by using condenser lens 10. The light condensed on the one point is applied to color wheel 11, and temporally separated into lights of a plurality of colors by using color wheel 11.

Then, the light of each color enters into rod lens 12, and exits from rod lens 12 after it is repeatedly reflected in rod lens 12. The light output from rod lens 12 passes through condenser lenses 13 and 14, is reflected by using reflection mirror 15, and further passes through condenser lens 16 to be applied to reflective image forming element 17.

The light applied to reflective image forming element 17 is modulated and reflected by using reflective image forming element 17, and projected by using projection lens 18. For example, the light is projected on a screen to display an image on the screen.

Light emitting element 2 includes element body 19, and a plurality of lead terminals (may be simply referred to as "terminal") 20 extending from one surface 19a of element body 19 in a direction intersecting surface 19a. Lead terminal 20 is electrically connected to substrate 21 (refer to FIGS. 2 to 6), and light emitting element 2 receives power from substrate 21 to generate light.

Hereinafter, a structure for cooling light emitting element 2 will be described. Here, the example of cooling light emitting element 2 that is a semiconductor element will be described. However, the semiconductor element to which the present invention can be applied is not limited to light emitting element 2. The present invention can be applied to the cooling structure of a semiconductor element that generates heat. Therefore, the projection type display apparatus to which the present invention can be applied is not limited to the apparatus that includes the laser diode as a light source.

First Embodiment

A semiconductor element cooling structure according to the first embodiment of the present invention will be described referring to FIGS. 2 to 7.

Figure 2:
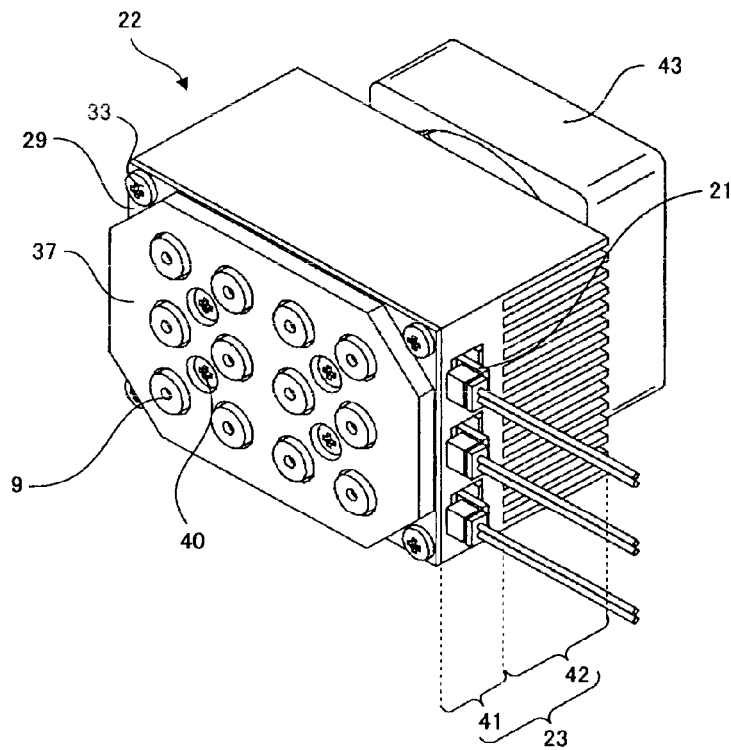
FIG. 2 A perspective view illustrating a semiconductor element cooling structure according to the first embodiment of the present invention.
Figure 3:
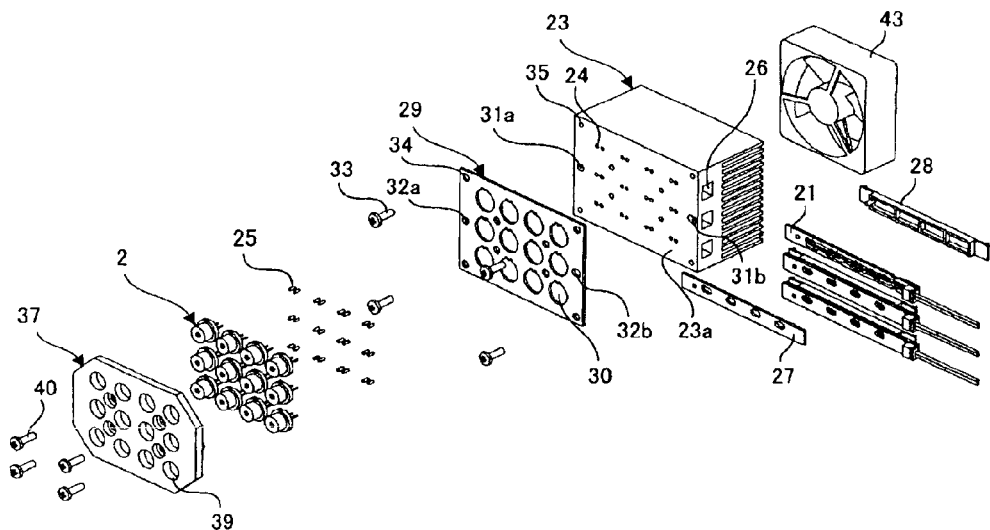
FIG. 3 An exploded perspective view illustrating the semiconductor element cooling structure according to the first embodiment.
Figure 4:
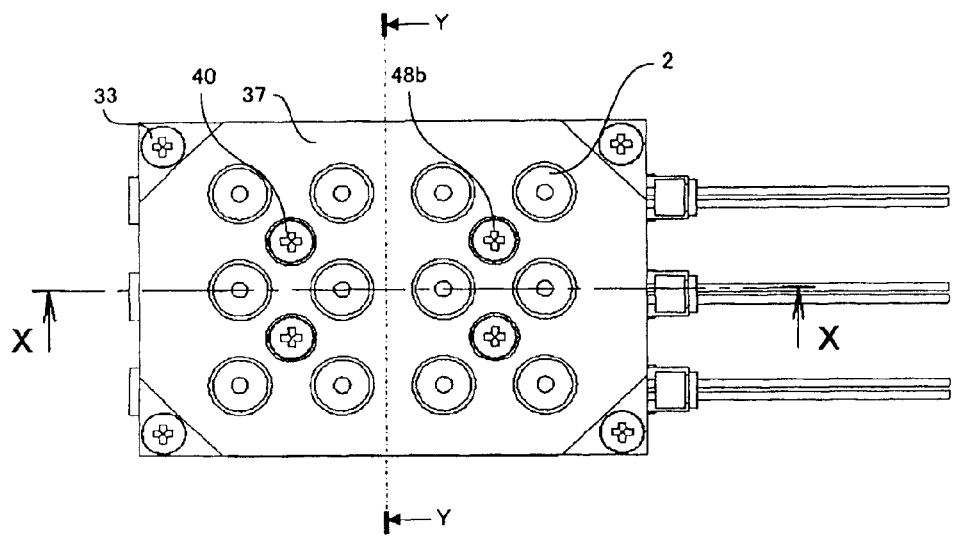
FIG. 4 A front view illustrating the semiconductor element cooling structure according to the first embodiment.
Figure 5:
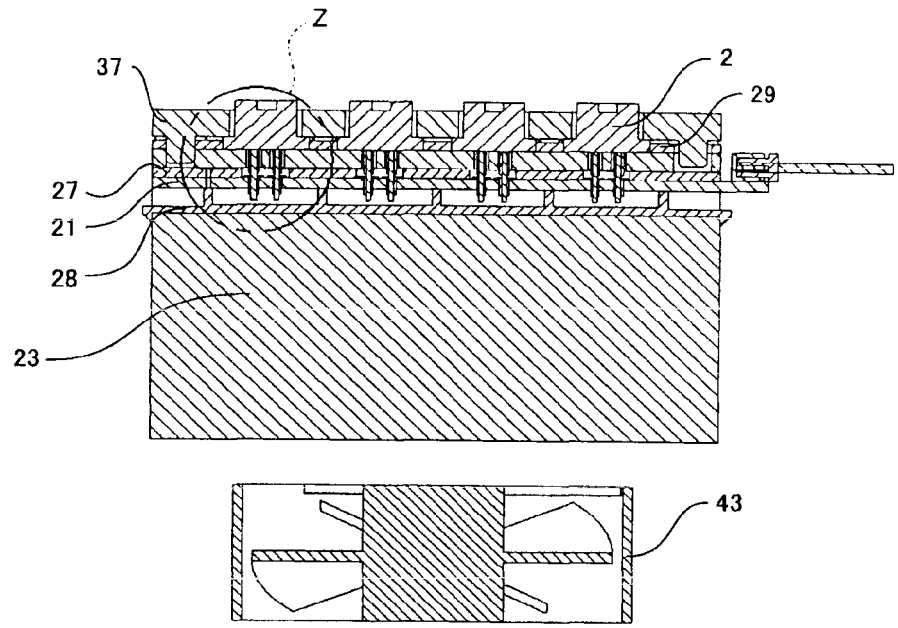
FIG. 5 A sectional view cut along the line X-X of the semiconductor element cooling structure according to the first embodiment illustrated in FIG. 4.
Figure 6:
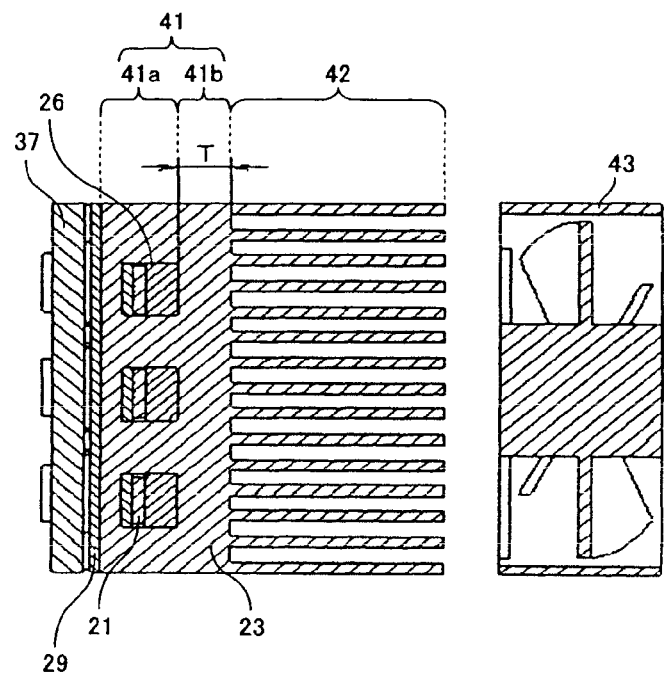
FIG. 6 A sectional view cut along the line Y-Y of the semiconductor element cooling structure according to the first embodiment illustrated in FIG. 4.
Figure 7:
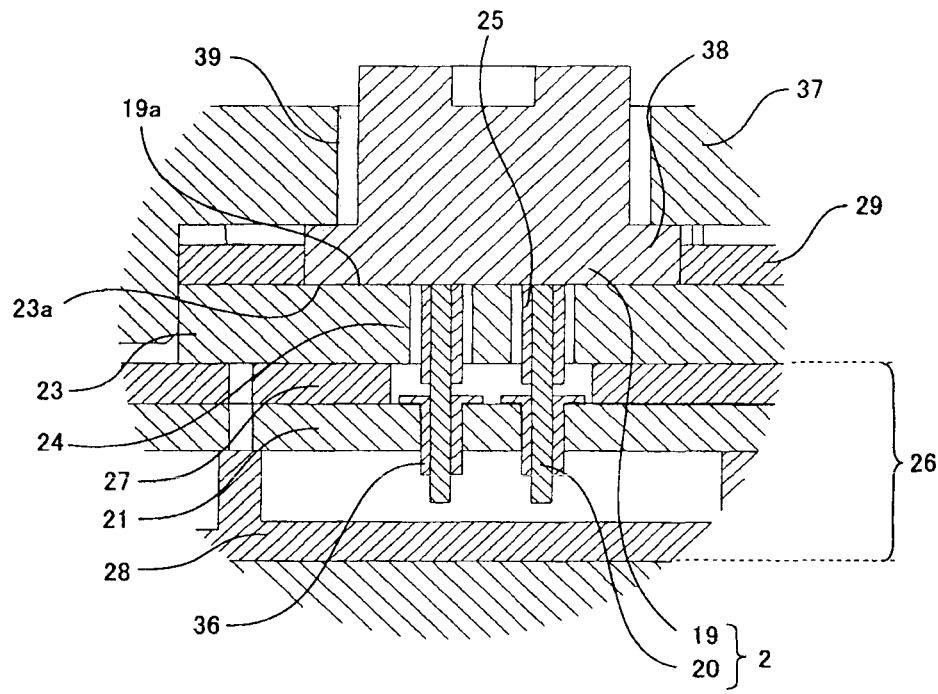
FIG. 7 An enlarged view illustrating in detail a Z portion illustrated in FIG. 5.

FIG. 2 is a perspective view illustrating the semiconductor element cooling structure according to this embodiment. FIG. 3 is an exploded perspective view illustrating the semiconductor element cooling structure. FIG. 4 is a front view illustrating the semiconductor element cooling structure. FIG. 5 is a sectional view cut along the line X-X of the semiconductor element cooling structure illustrated in FIG. 4. FIG. 6 is a sectional view cut along the line Y-Y of the semiconductor element cooling structure illustrated in FIG. 4. FIG. 7 is an enlarged view illustrating in detail a Z portion illustrated in FIG. 5.

As illustrated in FIGS. 2 to 7, semiconductor element cooling structure 22 according to this embodiment includes heat sink 23 for absorbing heat from light emitting element 2.

Heat sink 23 includes heat receiving unit 41, and heat radiation unit 42 disposed adjacently to heat receiving unit 41 to radiate heat from heat receiving unit 41. The inclusion of heat radiation unit 42 in heat sink 23 facilitates the heat radiation of heat sink 23 and thus the movement of the heat of light emitting element 2 to heat sink 23. As a result, light emitting element 2 is cooled more efficiently. Heat receiving unit 41 includes element contact portion 41a to which light emitting element 2 is fitted, and heat diffusion portion 41b that is contact with the heat radiation unit.

Element contact portion 41a includes contact surface 23a that is contact with one surface 19a of element body 19, and a plurality of through-holes 24 formed in contact surface 23a. To prevent lead terminal 20 from coming into contact with the inner surface of through-hole 24, insulation member 25 may be disposed in a portion opposite the inner surface of through-hole 24. The sectional shape of through-hole 24 is not limited to a circular shape but may be an elliptic or rectangular shape.

Element contact portion 41a further includes space portion 26 for housing substrate 21. Space portion 26 communicates with the plurality of through-holes 24. Substrate 21 is sandwiched between first and second holding members 27 and 28 to be held in space portion 26. The plurality of lead terminals 20 is inserted into the plurality of through-holes 24 to be electrically connected to substrate 21 held in space portion 26.

Positioning member 29 for defining the position of light emitting element 2 may be disposed on contact surface 23a (element contact portion 41a). Positioning member 29 includes through-hole 30 for inserting light emitting element 2. By inserting light emitting element 2 into through-hole 30, the position of light emitting element 2 with respect to positioning member 29 is determined. By positioning and fixing positioning member 29 to come into contact with surface 23a, light emitting element 2 is easily set at a predetermined position.

The positioning of positioning member 29 on contact surface 23a is carried out as follows.

Positioning member 29 includes positioning holes 32a and 32b corresponding to positioning holes 31a and 31b arranged on contact surface 23a of heat sink 23 (heat receiving unit 41). By accurately matching the positions of positioning holes 32a and 32b with those of positioning holes 31a and 31b by using tools such as pins, positioning member 29 is accurately set at a predetermined position on contact surface 23a of heat sink 23. It is preferable that one of positioning holes 31a or 31b arranged on contact surface 23a of heat sink 23 be a long hole.

Through-hole 34 for inserting screw 33 is formed in positioning member 29, and screw hole 35 is formed in contact surface 23a of heat sink 23. Positioning member 29 is fixed to come into contact with surface 23a of heat sink 23 by the screw.

Thus, positioning member 29 is positioned on contact surface 23a, and light emitting element 2 is accurately set at the predetermined position on contact surface 23a.

According to this embodiment, since through-hole 24 for inserting lead terminal 20 is formed in contact surface 23a of heat sink 23, one surface 19a of element body 19 can come into contact with contact surface 23a. Thus, the heat of element body 19 is absorbed from contact surface 23a to heat sink 23 to cool light emitting element 2. Through-hole 24 may be formed individually for each lead terminal 20. Two or more lead terminals may be inserted into one through-hole.

A contact surface between element body 19 and heat sink 23 may be coated with heat conductive grease that is a heat conductive substance. The heat conductive grease reduces heat resistance between element body 19 and heat sink 23, thereby facilitating movement of the heat of element body 19 to heat sink 23.

According to this embodiment, light emitting element 2 includes two lead terminals 20. However, the present invention can be applied to a structure for cooling a light emitting element that includes three or more lead terminals 20.

According to this embodiment, space portion 26 is defined by using the hole that penetrates heat sink 23 (heat receiving unit 41) along contact surface 23a. However, the hole defining space portion 26 may not penetrate the heat sink.

Semiconductor element cooling structure 22 may further include socket 36 into which lead terminal 20 is inserted to be electrically connected to substrate 21. Socket 36 is, for example, a member formed so as to fit lead terminal 20 therein.

By using socket 36, lead terminal 20 is only inserted into socket 36 to be electrically connected to substrate 21. Accordingly, even after substrate 21 has been housed in space portion 26 and lead terminal 20 has been inserted into through-hole 24, lead terminal 20 is electrically connected to substrate 21 easily. This eliminates the necessity of soldering and wire laying, and thus the number of assembling steps can be greatly reduced.

Semiconductor element cooling structure 22 may further include pressing member 37 for pressing light emitting element 2 to heat sink 23. Pressing member 37 includes through-hole 39 through which projected portion 38 of light emitting element 2 never passes. In the state in which the opening edge of through-hole 39 is in contact with projected portion 38, when pressing member 37 is pressed to heat sink 23 by using male screw 40, light emitting element 2 is pressed to heat sink 23.

Pressing light emitting element 2 to heat sink 23 reduces heat resistance between element body 19 and heat sink 23, thereby cooling light emitting element 2 more efficiently.

As illustrated in FIG. 6, heat diffusion portion 41b is disposed between space portion 26 and heat radiation unit 42. In other words, as indicated by symbol T in FIG. 6, the portion between the end of space portion 26 nearer to heat radiation unit 42 side and heat radiation unit 42 is heat diffusion portion 41b. The heat generated at light emitting element 2 passes through contact surface 23a and spreads to element contact portion 41a. The heat conductivity of space portion 26 is lower than that of the other portions of element contact portion 41a. Therefore, the heat generated at light emitting element 2 is conducted to heat diffusion portion 41b without passing through space portion 26, and spreads to entire heat diffusion portion 41b.

At this time, since element contact portion 41a and heat diffusion portion 41b are integrally formed, heat resistance between element contact portion 41a and heat diffusion portion 41b is extremely low, and the heat generated at light emitting element 2 is efficiently conducted to heat diffusion portion 41b. Then, the heat that spreads to heat diffusion portion 41b (heat receiving unit 41) is conducted to heat radiation unit 42, and discharged into air from heat radiation unit 42.

In this embodiment, the thickness (T in FIG. 6) of heat diffusion portion 41b is 5 mm. However, the thickness is only required to be within 3 to 8 mm. When the thickness (T in FIG. 6) is smaller than 3 mm, the heat conductivity from element contact portion 41a to heat diffusion portion 41b declines. On the other hand, when the thickness (T in FIG. 6) is larger than 8 mm, the heat conductivity from heat diffusion portion 41b to heat radiation unit 42 declines.

It is more preferred to integrally form heat receiving unit 41 (heat diffusion portion 41b) and heat radiation unit 42. It is because this integral formation facilitates the movement of the heat from heat receiving unit 41 to heat radiation unit 42, and thus it is difficult for the temperature of heat receiving unit 41 to increase.

It is more preferred that the slit direction of heat radiation unit 42 be similar to the extending direction of space portion 26 of heat sink 23. In this case, for example, heat sink 23 made of a metallic material such as aluminum can be formed by extrusion molding, and integrally formed more easily.

Semiconductor element cooling structure 22 may further include cooling fan 43 for cooling heat sink 23. Cooling heat sink 23 facilitates the movement of the heat of light emitting element 2 to heat sink 23, and light emitting element 2 is cooled more efficiently.

Thus, according to this embodiment, since through-hole 24 can be reduced in size, the contact surface between element body 19 and heat sink 23 is larger, and light emitting element 2 can be cooled more efficiently. By using semiconductor element cooling structure 22 according to this embodiment, it is difficult for the temperature of light emitting element 2 to increase. Therefore, a projection type display apparatus having a high illuminance and high temporal illuminance rate can be provided.

Second Embodiment

Next, a semiconductor element cooling structure according to the second embodiment of the present invention will be described referring to FIGS. 8 and 9. Components similar to those illustrated in FIGS. 2 to 7 are denoted by similar reference numerals, and description thereof will be omitted.

Figure 8:
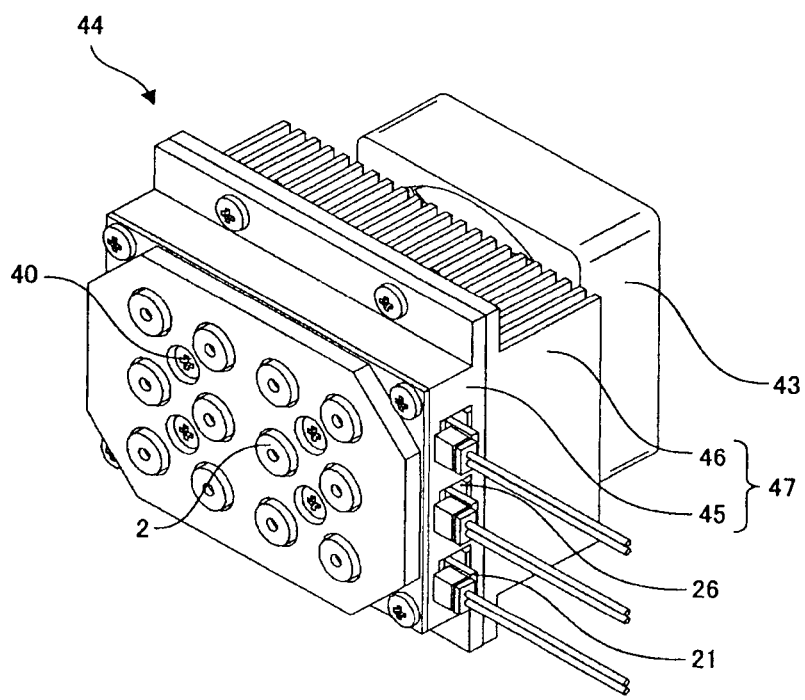
FIG. 8 A perspective view illustrating a semiconductor element cooling structure according to the second embodiment of the present invention.

FIG. 8 is a perspective view illustrating the semiconductor element cooling structure according to this embodiment. As illustrated in FIG. 8, semiconductor element cooling structure 44 according to this embodiment is provided with heat sink 47 that includes base block 45 including contact surface 23a and radiation fin block 46 disposed adjacently to base block 45 and configured to radiate heat from base block 45. Base block 45 and radiation fin block 46 are separately formed. Here, base block 45 corresponds to heat receiving unit 41 of the first embodiment, and radiation fin block 46 corresponds to heat radiation unit 42 of the first embodiment.

Figure 9:
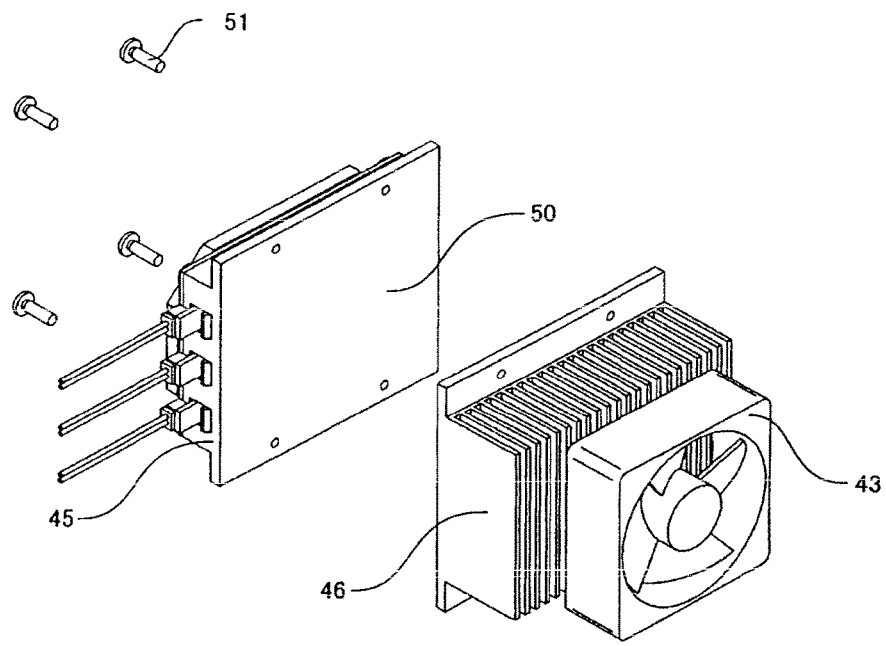
FIG. 9 A perspective view illustrating semiconductor element cooling structure 44 in a state where a base block and a radiation fin block are separated from each other.

FIG. 9 is a perspective view illustrating semiconductor element cooling structure 44 in a state where base block 45 and radiation fin block 46 are separated from each other.

According to this embodiment, base block 45 and radiation fin block 46 can be separately formed by extrusion molding using metals such as aluminum. Therefore, the slit direction of radiation fin block 46 may be different from the extending direction of space portion 26 for housing substrate 21.

Contact surface 50 between base block 45 and radiation fin block 46 may be coated with heat conductive grease that is a heat conductive substance. The heat conductive grease reduces heat resistance between base block 45 and radiation fin block 46, thereby facilitating the movement of the heat of base block 45 to radiation fin block 46. Further, contact surface 50 may be a curved surface.

Base block 45 and radiation fin block 46 may be fixed to each other by screws 51. Alternatively, base block 45 and radiation fin block 46 may be coupled together by soldering or brazing. Coupling base block 45 and radiation fin block 46 together more strongly facilitates the movement of the heat from base block 45 to radiation fin block 46, thereby cooling light emitting element 2 more efficiently.

Thus, according to this embodiment, light emitting element 2 can be cooled more efficiently. By using semiconductor element cooling structure 22 according to this embodiment, a projection type display apparatus having a high illuminance and high temporal illuminance rate can be provided.

Third Embodiment

Next, a semiconductor element cooling structure according to the third embodiment of the present invention will be described referring to FIG. 10. Components similar to those illustrated in FIGS. 2 to 9 are denoted by similar reference numerals, and description thereof will be omitted.

Figure 10:
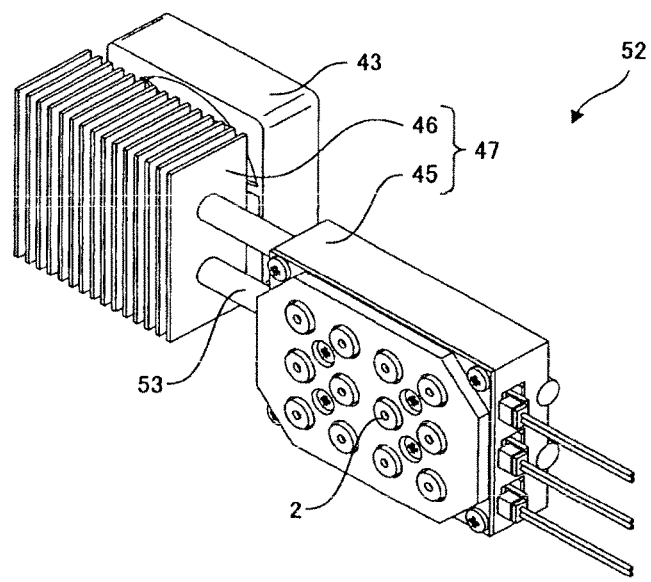
FIG. 10 A perspective view illustrating a semiconductor element cooling structure according to the third embodiment of the present invention.

FIG. 10 is a perspective view illustrating the semiconductor element cooling structure according to this embodiment. As illustrated in FIG. 10, semiconductor element cooling structure 52 is provided with heat sink 47 that includes base block 45 and radiation fin block 46 separated from base block 45. Radiation fin block 46 is connected to base block 45 by using heat moving means such as heat pipe 53. Here, base block 45 corresponds to heat receiving unit 41 of the first embodiment, and radiation fin block 46 and heat pipe 53 correspond to heat radiation unit 42 of the first embodiment.

More specifically, one end of heat pipe 53 is coupled to base block 45 by soldering. The other end of heat pipe 53 is coupled to radiation fin block 46 by soldering or brazing. The heat of base block 45 passes through heat pipe 53 to move to radiation fin block 46. Thus, base block 45 is cooled, and light emitting element 2 is cooled.

Radiation fin block 46 may be cooled by using cooling fan 43.

This embodiment is advantageous when no space for disposing radiation fin block 46 or cooling fan 43 near light emitting element 2 can be secured. Since the heat of light emitting element 2 moves to radiation fin block 46 via base block 45 and heat pipe 53, light emitting element 2 is cooled more efficiently.

As described above, according to this embodiment, light emitting element 2 can be cooled more efficiently. By using semiconductor element cooling structure 22 according to this embodiment, a projection type display apparatus having a high illuminance and high temporal illuminance rate can be provided.

The embodiments of the present invention have been described. However, the present invention is not limited to the embodiments. Various changes and modifications understandable to those skilled in the art can be made to the form and the specifics without departing from the technical teachings of the present invention.

REFERENCE NUMERALS

2 Semiconductor element
20 Terminal
21 Substrate
22 Semiconductor element cooling structure
23*a* Contact surface
24 Through-hole
26 Space portion
41 Heat receiving unit
41*a* Element contact portion
41*b* Heat diffusion portion
42 Heat radiation unit

The invention claimed is:

1. A semiconductor element cooling structure for cooling a semiconductor element, comprising:
   a heat receiving unit configured to receive heat emitted from the semiconductor element; and
   a heat radiation unit configured to radiate the heat from the heat receiving unit,
   wherein:
      the heat receiving unit includes an element contact portion having a contact surface to which one surface of the semiconductor element is fitted, and a heat diffusion portion that is contacted with the element contact portion and the heat radiation unit;
      the element contact portion includes a space portion;
      the contact surface includes a through-hole which communicates with the space portion and through which a terminal of the semiconductor element is inserted;
      the space portion houses a substrate to which the terminal of the semiconductor element is connected; and
      a thickness of the heat diffusion portion in a direction from the space portion to the heat radiation unit is in a range of 3 mm to 8 mm,
   wherein the heat diffusion portion is disposed between the space portion and the heat radiation unit.

2. The semiconductor element cooling structure according to claim 1, wherein the element contact portion and the heat diffusion portion are integrally formed.

3. The semiconductor element cooling structure according to claim 2, wherein the heat receiving unit and the heat radiation unit are integrally formed.

4. The semiconductor element cooling structure according to claim 2, wherein the heat receiving unit and the heat radiation unit are in contact with each other via a heat conductive substance.

5. The semiconductor element cooling structure according to claim 1, wherein the substrate includes a socket into which the terminal is inserted.

6. The semiconductor element cooling structure according to claim wherein the heat radiation unit includes a plurality of fins.

7. The semiconductor element cooling structure according to claim 1, wherein the semiconductor element comprises a light emitting element.

8. An electronic apparatus comprising the semiconductor element cooling structure according to claim 1.

9. The electronic apparatus according to claim 8, wherein the electronic apparatus comprises a projection type display apparatus.

10. The semiconductor element cooling structure according to claim 1, wherein the contact surface includes a plurality of through-holes formed individually for each terminal of the semiconductor element.

11. The semiconductor element cooling structure according to claim 1, further comprising a pressing member for pressing the semiconductor element to the heat receiving unit.

12. The semiconductor element cooling structure according to claim 11, wherein the pressing member includes a through-hole through which a projected portion of the semiconductor element never passes.

13. The semiconductor element cooling structure according to claim 1, wherein a heat conductivity of the space portion is less than a heat conductivity of the element contact portion.

\* \* \* \* \*